(12) United States Patent
Murakami

(10) Patent No.: US 6,828,506 B2
(45) Date of Patent: Dec. 7, 2004

(54) WIRING STRUCTURE

(75) Inventor: Yoshinori Murakami, Shinjuku-ku (JP)

(73) Assignee: Nissan Motor Co., Ltd., Yokohama (JP)

(*) Notice: Subject to any disclaimer, the term of this patent is extended or adjusted under 35 U.S.C. 154(b) by 0 days.

(21) Appl. No.: 10/445,037

(22) Filed: May 27, 2003

(65) Prior Publication Data

US 2003/0226685 A1 Dec. 11, 2003

(30) Foreign Application Priority Data

Jun. 7, 2002 (JP) ........................................ 2002-167509

(51) Int. Cl.⁷ .............................................. H01B 7/08
(52) U.S. Cl. .............................................. 174/117 FF
(58) Field of Search ........................ 174/117 F, 117 FF, 174/36, 88 R

(56) References Cited

U.S. PATENT DOCUMENTS

| | | | | |
|---|---|---|---|---|
| 3,541,473 A | * | 11/1970 | Schlicke et al. | ............... 333/12 |
| 4,442,315 A | * | 4/1984 | Segawa | .......................... 174/36 |
| 4,825,279 A | | 4/1989 | Furuhata | |
| 5,068,632 A | * | 11/1991 | Champeau | ................... 333/238 |
| 5,136,123 A | * | 8/1992 | Kobayashi et al. | ......... 174/258 |
| 5,414,616 A | | 5/1995 | Hatozaki | |
| 5,444,295 A | | 8/1995 | Lake et al. | |
| 6,320,133 B1 | * | 11/2001 | Rimmer | ................... 174/117 F |
| 2002/0034088 A1 | | 3/2002 | Parkhill et al. | |

FOREIGN PATENT DOCUMENTS

EP            0 987 761 A2      3/2000

* cited by examiner

*Primary Examiner*—Chau N. Nguyen
(74) *Attorney, Agent, or Firm*—Shinjyu Global IP Counselors, LLP

(57) ABSTRACT

A wiring or electrode structure is configured to reduce the wiring inductance of the power conductors in a semiconductor power module and prevent as much as possible the emission of interference electromagnetic waves. The wiring or electrode structure has an insulation layer that faces a main surface of a conductive base layer, a first conductor that faces the surface of the insulation layer, and a second conductor through which current flows in the opposite direction as the current that flows in the first conductor. The second electrical conductor overlying the first electrical conductor such opposite longitudinal edges of the second electrical conductor extend beyond corresponding longitudinal edges of the first electrical conductor at all locations by predetermined distances.

15 Claims, 18 Drawing Sheets

111  112

11  12

US 6,828,506 B2

WIRING STRUCTURE

BACKGROUND OF THE INVENTION

1. Field of the Invention

The present invention generally relates to a wiring structure. More specifically, the present invention relates to a wiring structure that is mainly used inside semiconductor electric power modules.

2. Background Information

A conventional power module typically has a metal base plate with an insulation plate overlying the metal base plate and internal wiring overlying the insulation plate. The metal base plate serves as a base plate for the module, and is often made of a copper plate of approximately four millimeters in thickness. The insulation plate is normally made of ceramic, and is connected to the metal base plate with solder.

The internal wiring is electrically connected to a pair of electrodes such as a collector electrode and an emitter electrode. The electrodes are often made of a copper plate of approximately one millimeter in thickness. One end of each electrode is exposed on the outside of the module and has a threaded hole so that it can be screw-connected to an external bus bar. The other ends of the electrodes are connected to the internal wiring that is arranged on the insulation plate. The internal wiring includes an emitter conductor and a collector conductor, which are often made of copper foils that are formed so as to be closely adhered to the insulation plate. Thus, the emitter conductor is electrically connected to the emitter electrode, and the collector conductor is electrically connected to the collector electrode.

A semiconductor chip is soldered onto the collector conductor. Thus, the undersurface of the semiconductor chip has the collector conductor formed thereon. Meanwhile, an aluminum wire is electrically connected between an emitter pad on a top portion of the semiconductor chip and the emitter conductor.

In view of the above, it will be apparent to those skilled in the art from this disclosure that there exists a need for an improved wiring structure. This invention addresses this need in the art as well as other needs, which will become apparent to those skilled in the art from this disclosure.

SUMMARY OF THE INVENTION

It has been discovered that with the structure just described, the wiring inductance is large because the electrodes (collector electrode and emitter electrode) are separated by some distance. In addition, induced voltages limit the drive conditions of the device during high-speed switching. Also, electromagnetic waves are generated from the electrodes and cause electromagnetic interference (EMI) in the surrounding drive circuitry by frequent switching. The tendency for this problem to occur is particularly strong in intelligent power modules (IPM), in which the drive circuits are integrated inside the module. To avoid this problem, such modules are generally provided with a shielding plate in the vicinity of the drive circuitry.

However, the use of shielding plates and the like does not address the root cause of the problem. The present invention was conceived in order to solve this problem and seeks to provide a semiconductor power module or a wiring structure that uses the same wiring materials as conventional structures, while reduces the wiring inductance of the power wiring in a semiconductor power module and prevents as much as possible the emission of interference causing electromagnetic waves.

In order to achieve the aforementioned object, the wiring structure of the present invention comprises a conductive base layer, an insulation layer, a first electrical conductor and a second electrical conductor. The conductive base layer has a first main surface. The insulation layer has a first side surface facing the first main surface of the conductive base layer. The first electrical conductor faces a second side surface of the insulation layer and is configured with a first current flowing direction. The second electrical conductor is configured with a second current flowing direction that is opposite to the first current flowing direction of the first electrical conductor. The second electrical conductor overlies the first electrical conductor such opposite longitudinal edges of the second electrical conductor extend beyond corresponding longitudinal edges of the first electrical conductor at all locations by predetermined distances.

These and other objects, features, aspects and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

Referring initially to FIGS. 1 to 5, a wiring structure is illustrated in accordance with a first embodiment of the present invention. The wiring structure is incorporated into a semiconductor power module, which is partially depicted into a simplified form for purposes of illustration. The precise construction and circuitry of the semiconductor power module is not important to the understanding of the wiring structure of the present invention. Rather, the wiring structure of the present invention can be utilized with a variety of semiconductor power modules.

Figure 1:
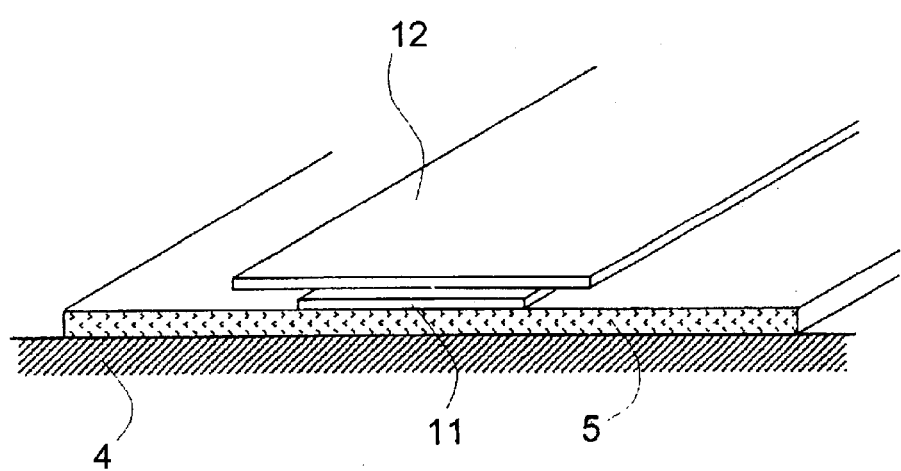
FIG. 1 is a partial perspective view of a wiring structure in accordance with the first embodiment of the present invention.
Figure 2:
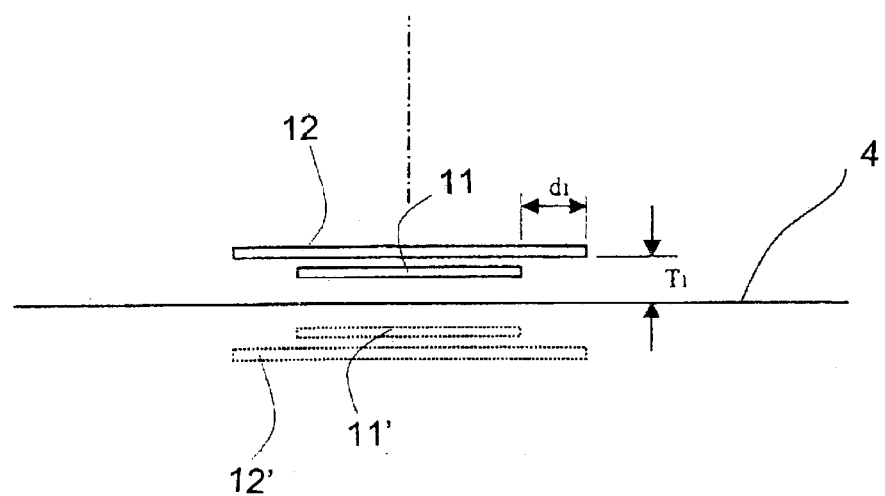
FIG. 2 is a diagrammatic transverse cross sectional view of the first and second conductors for explaining the mirror image of the conductors shown in FIG. 1 in accordance with the first embodiment of the present invention.

As seen in FIGS. 1 and 2, basically, the wiring structure of the present invention includes a conductive base layer 4, an insulation layer 5, a first electrical conductor 11 with a first electrode (not shown) coupled thereto, and a second electrical conductor 12 with a second electrode (not shown) coupled thereto. The first and second electrical conductors 11 and 12 are connected to a semiconductor chip (not shown), preferably in a conventional manner. The wiring structure of the present invention is mounted in a plastic module outer shell (not shown) of the semiconductor power module. These electrodes of the first and second electrical conductors 11 and 12 are made of a conductive metal such as a copper plate of approximately one millimeter in thickness. The outer end of each of the electrodes of the first and second conductors 11 and 12 is exposed on the outside of the module, and has a threaded hole so that it can be screw-connected to an external bus bar in a conventional manner. The first electrical conductors 11 and 12 are electrically coupled to the first and second electrodes, respectively in a conventional manner such as soldering.

The first conductor 11 (hereinafter called "conductor 11") is formed directly on the insulation layer 5, preferably in a conventional manner. The second conductor 12 (hereinafter called "conductor 12") is arranged to cover the conductor 11 and carries current that flows in the opposite direction of the current that flows in the conductor 11. The conductive base layer 4 serves as the base plate of the module. The insulation layer 5 is fixed to the conductive base layer 4 by solder.

The insulation layer 5 is mainly constructed of ceramic. The conductor 11 is made of copper foil or aluminum foil having a thickness of several hundred micrometers, and is formed so as to adhere to the surface of the insulation layer 5. The conductor 12 is also made of copper foil or aluminum foil having a thickness of several hundred micrometers. And the conductor 12 is arranged to overlie the conductor 11 with a certain distance maintained therebetween. The distance is kept, for instance, by inserting a thin insulating film between them. With the present invention, the transverse width of the conductor 12 is larger than the transverse width of the conductor 11, as seen in FIG. 1. Thus, this arrangement shown in FIGS. 1 and 2 makes it possible to suppress the electromagnetic waves emitted from between the two conductors 11 and 12.

In short, the insulation layer 5 of this embodiment has a first side or main surface facing a first base or main surface of the conductive base layer 4. The conductor 11 faces a second side or main surface of the insulation layer 5. The conductor 12 with its electrode is arranged relative to the conductor 11 such that the current flows in the opposite direction as the current that flows through the conductor 11 and its electrode. As viewed along a line of sight normal to the first base or main surface of the conductive base layer 4, the conductor 12 entirely covers the conductor 11 in the lateral direction. In other words, both longitudinal edge parts of the second conductor 12 protrude beyond the longitudinal edges of the first conductor 11 at all locations.

By adopting such a configuration, the emission of interference-causing electromagnetic waves from the high-voltage wiring inside a power module can be suppressed while using the same wiring materials as are used in conventional modules. Additionally, since the capacitance between conductors 11 and 12 is increased and the wiring inductance is reduced, the induced power (which affects the transistor) that results during switching is reduced and the collector voltage overshoot value at turn-off is reduced. As a result, the switching speed can be increased. From another perspective, large currents can be driven unimpededly while leaving the switching speed the same.

In particular, the structure of this embodiment enables the EMI emitted from between the conductor 11 and the conductor 12 to be suppressed by utilizing the mirror imaging capacity of a conductive material.

FIG. 2 is a diagrammatic cross sectional view for explaining the effects of the configuration shown in FIG. 1 and illustrates the mirror reflection produced by the conductive base layer 4. In FIG. 2, the reference numerals 11' and 12' are the electromagnetic images of the conductor 11 and the conductor 12. For example, if the conductor 11 is at an electric potential of V1 and the conductor 12 is at an electric potential of V2, the surrounding electric field is distributed in the same manner as it would be if the conductive base layer 4 did not exist and, instead, a conductor 11' having an electric potential of −V1 and a conductor 12' having an electric potential of −V2 were provided where the conductive base layer 4 is. When the electric field around the electrodes is suppressed, the spread of the magnetic field is suppressed in a relative manner (because the magnetic field correlates to the change in electric field with respect to time). Thus, the emission of electromagnetic waves is suppressed. Next, the effect of suppressing the emission of electromagnetic waves is explained in terms of the electric field distribution.

Figure 3:
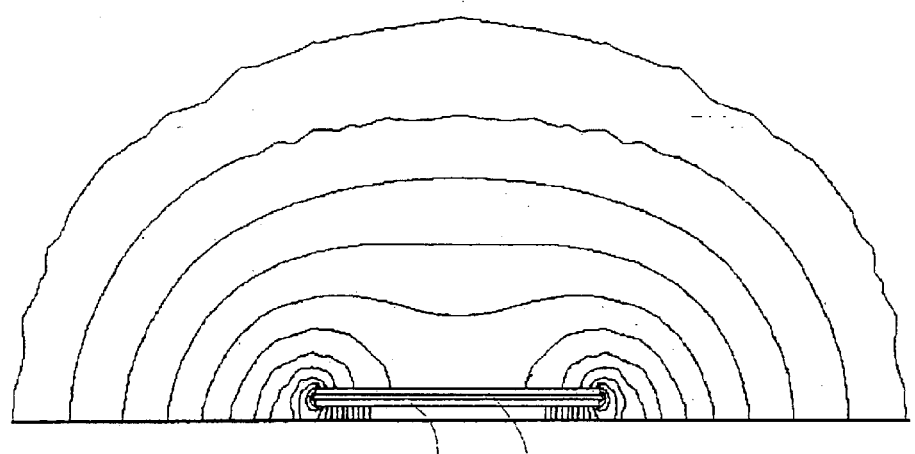
FIG. 3 shows the electric field strength distribution surrounding the conductors when a potential difference is applied between two conductors of the same width.

FIG. 3 shows an example calculation of the surrounding electric field distribution in a situation in which the conductors 11 and 12 have the same transverse width and each carries a different electric potential. The equipotential lines are arranged on a logarithmic scale such that sixteen equipotential lines represent four orders of magnitude of electric field strength difference.

Figure 4:
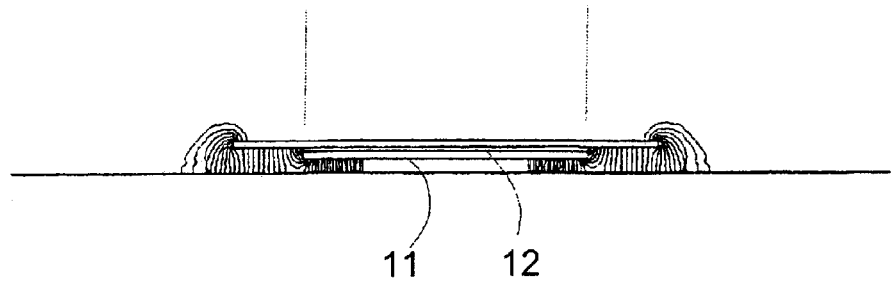
FIG. 4 shows the electric field strength distribution surrounding the conductors when a potential difference is applied between two conductors having different widths in accordance with the first embodiment of the present invention.

Meanwhile, FIG. 4 shows the electric field distribution in a case in which the edge parts of the conductor 12 protrude beyond the longitudinal edge parts of the conductor 11. The scale of the equipotential lines is the same as in FIG. 3. By merely making the transverse width of the conductor 12 a little larger, the electric field distribution surrounding the conductors is greatly reduced.

Figure 5:
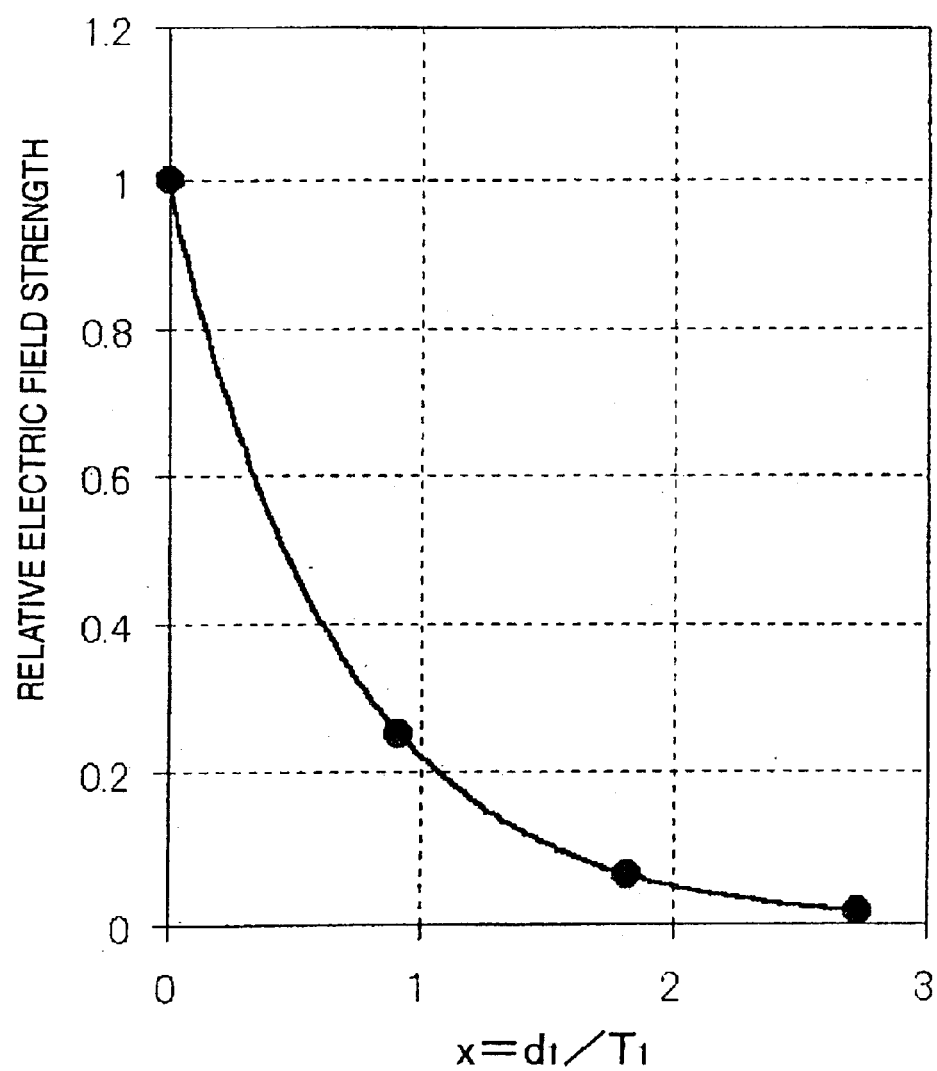
FIG. 5 is a graph illustrating the dependence of the electric field strength surrounding the conductors relative to the parameter (d1/T1) in accordance with the first embodiment of the present invention.

The effect of suppressing the spread of the electric field to the areas surrounding the conductors is dependent on the way in which the conductor 12 extends over the conductor 11. If, as shown in FIG. 2, the distance from the conductive base layer 4 to the conductor 12 is defined to be a distance T1 and the protruding distance of the conductor 12 from the longitudinal edge of the conductor 12 is defined to be a distance d1, then the value $x=d1/T1$ is a parameter with which EMI can be correlated. FIG. 5 is a plot of the electric field strength versus the parameter x for an arbitrary point above the centerline (dotted line in FIG. 2) of the conductors 11 and 12 using the case shown in FIG. 3 as a reference. Thus, when $x=0.5$, the electric field strength is one-half of the electric field strength when $x=0$, which corresponds to the case shown in FIG. 3. This indicates an electromagnetic wave suppressing effect. At $x=1.5$, the electric field strength is reduced to $1/10$. At $x=3$, the electric field strength is reduced to $1/100$. Incidentally, the case shown in FIG. 4 corresponds to the situation where $x=1.8$. This calculation ignores differences in such factors as the dielectric constant of the insulation layer 5. The dielectric constant of a substance is higher than the dielectric constant of a vacuum (or of air), so the existence of a dielectric material tends to suppress the spread of the electromagnetic field.

Thus, when a configuration is adopted in which the distance d1 (the distance by which the longitudinal edge parts of the second conductor 12 protrude beyond the longitudinal edges of the first conductor 11) is at least one-half the distance T1 (the distance of the longitudinal edges of the second conductor 12 to the conductive base layer 4), then the EMI emitted from the conductors 11 and 12 arranged on the insulation layer 5 is greatly suppressed.

Although the cross section of the conductor 12 is depicted as that of a flat plate in FIG. 1, it will be apparent to those skilled in the art from this disclosure that the cross sectional shape of the conductor 12 can be any shape so long as the distance from the longitudinal edge parts of the conductor 12 to the conductive base layer 4 is substantially the same as in the drawings and explained herein to carry out the present invention.

Second and Third Embodiments

Figure 6:
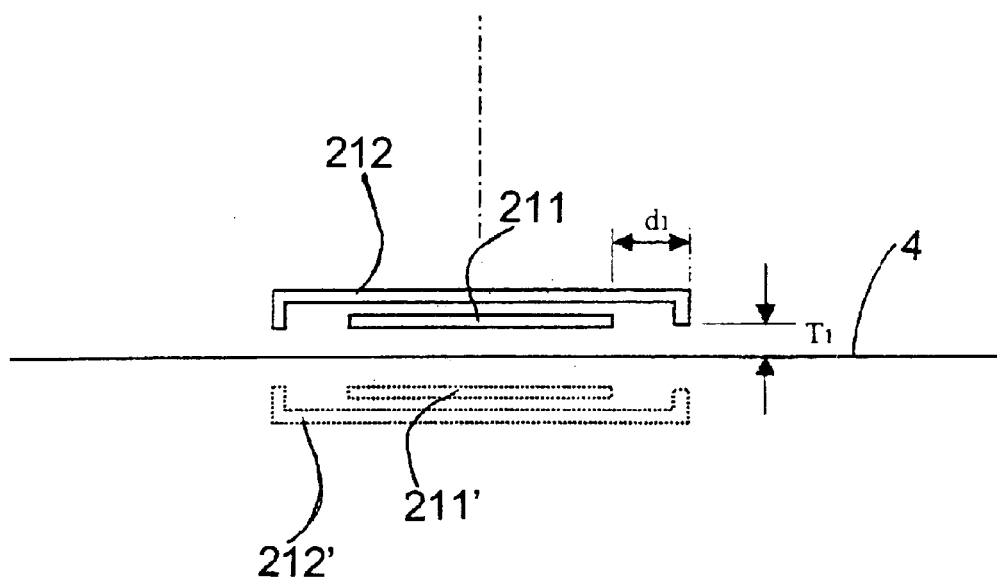
FIG. 6 is a diagrammatic transverse cross sectional view illustrating a variation on the configuration shown in FIG. 2, with the end parts of the second conductor being bent toward the insulation layer in accordance with a second embodiment of the present invention.
Figure 7:
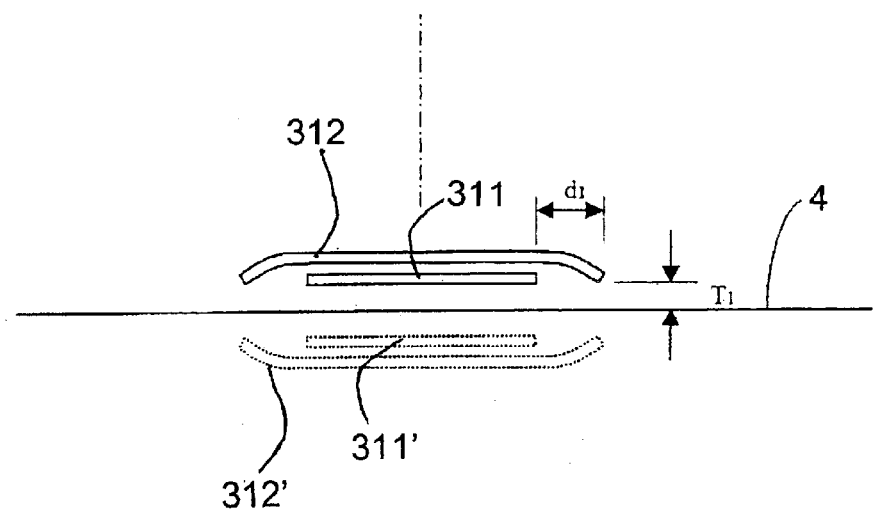
FIG. 7 is a diagrammatic transverse cross sectional view illustrating a variation on the configuration shown in FIG. 2, with the end parts of the second conductor being bent toward the insulation layer in accordance with a third embodiment of the present invention.

Referring now to FIGS. 6 to 7, alternate portions of wiring structures in accordance with second and third embodiments will now be explained. Basically, the wiring structures of second and third embodiments are replaced with the wiring structure of the first embodiment illustrated in FIG. 1. The wiring structure of the second embodiment includes a first conductor 211 and a second conductor 212 spaced apart from the first conductor 211 by a certain distance. Similarly to the first embodiment, the distance between the first conductor 211 and the second conductor 212 is maintained, for instance, by inserting a thin insulating film between them. These parts 211 and 212 are substituted for the parts 11 and 12 of the first embodiment, i.e., mounted on the conductive base layer 4 and the insulation layer 5 of the first embodiment. Similarly, the wiring structure of the third embodiment includes a first conductor 311 and a second conductor 312 spaced apart from the first conductor 311 by a certain distance. Similarly to the previously explained embodiments, the distance between the first conductor 311 and the second conductor 312 are maintained, for instance, by inserting a thin insulating film between them. These parts 311 and 312 are substituted for the parts 11 and 12 of the first embodiment, i.e., mounted on the conductive base layer 4 and the insulation layer 5 of the first embodiment. In view of the similarity between these embodiments and the first embodiment, the descriptions of the parts of the second and third embodiments that are substantially identical to the parts of the first embodiment may be omitted for the sake of brevity.

As shown in FIGS. 6 and 7, the longitudinal edge parts of the conductors 212 and 312 are bent towards their insulation layers 5, respectively. This arrangement is advantageous because it causes the value of x to increase. Thus, when a configuration is adopted in which the distance d1 by which the longitudinal edges of the second conductor 212 or 312 protrude beyond the edges of the conductor 211 or 311 is at least one-half of the distance T1 from the longitudinal edges of the conductor 212 or 312 to the conductive base layer 4, then the EMI emitted from the conductors 211 or 311 arranged on the conductive base layer 4 and the insulation layer 5 is greatly suppressed.

Fourth Embodiment

Referring now to FIGS. 8 to 13, a wiring structure in accordance with a fourth embodiment will now be explained. In view of the similarity between the first and fourth embodiments, the descriptions of the parts of the fourth embodiment that are substantially identical to the parts of the first embodiment may be omitted for the sake of brevity. Basically, the wiring structure of the fourth embodiment shows preferred electrode configurations that are used with the wiring structure of the first embodiment that is illustrated in FIGS. 1 and 2. The wiring structure of the fourth embodiment includes a first conductor 411 and a second conductor 412. Similarly to the previously explained embodiments, the distance between the first conductor 411 and the second conductor 412 is maintained, for instance, by inserting a thin insulating film between them. These parts 411 and 412 are substituted for the parts 11 and 12 of the first embodiment, i.e., mounted on the conductive base layer 4 and the insulation layer 5 of the first embodiment.

Figure 8:
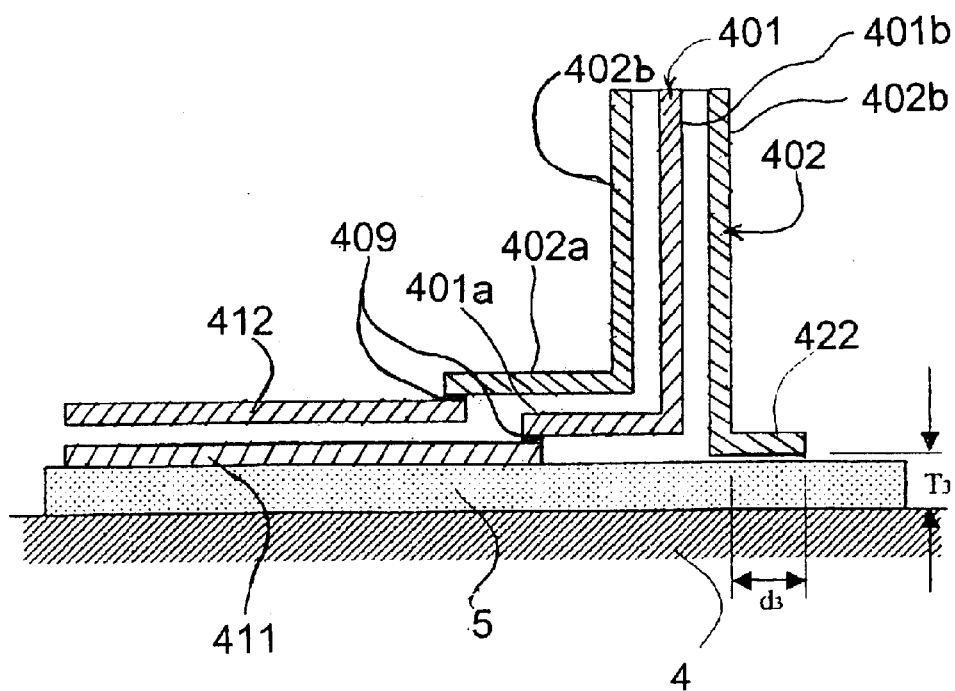
FIG. 8 is a partial diagrammatic longitudinal cross sectional view of a wiring structure in accordance with a fourth embodiment of the present invention as seen along section line 8—8 of FIG. 9.
Figure 9:
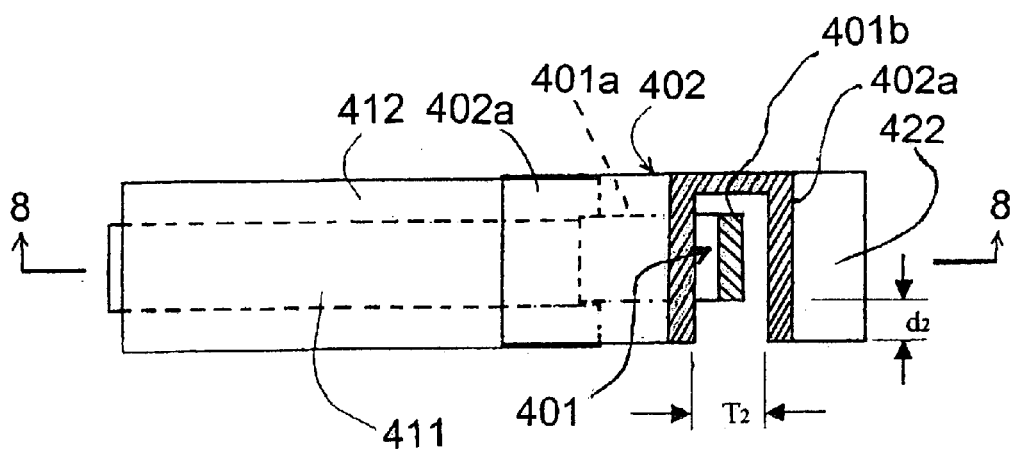
FIG. 9 is a partial top plan view of a wiring structure in accordance with the fourth embodiment of the present invention.

As seen in FIGS. 8 and 9, a first electrode 401 (hereinafter called "electrode 401") and a second electrode 402 (hereinafter called "electrode 402") are electrically connected to a conductor 411 and a conductor 412, respectively.

FIGS. 8 and 9 illustrate the electrode parts 401 and 402 that serve to draw electric signals to the outside of a transistor module from the conductors 411 and 412 that are connected to the respective electrodes 401 and 402 of a transistor chip mounted inside the module. FIG. 8 is a partial diagrammatic longitudinal cross sectional view taken along line 8-8 of FIG. 9 with the outer end portions broken away for purposes of illustration. FIG. 9 is a top plan view taken from above the structure shown in FIG. 8 with the outer end portions broken away for purposes of illustration.

The electrode 401 includes a bent part or end section 401a and a standing portion 401b extending perpendicularly from the bent part or end section 401a. The electrode 401 is made of a conductive metal such as a copper plate. The outer end (not shown) of the electrode 401 is exposed on the outside of the module and has a threaded hole so that it can be screw-connected to an external bus bar. The bent part or end section 401a is electrically connected to the main conductor for portion of the conductor 411 by solder 409 as shown in FIG. 8. Accordingly, in this embodiment, the electrode 401 and the conductor 411 together preferably constitute a first electrical conductor having a main conductor portion (the conductor 411 and the end section 401a) extending substantially parallel to the conductive base layer 4 and a standing portion (the standing portion 401b) extending from the main conductor portion in a direction away from the conductive base layer 4.

The electrode 402 includes a bent part or end section 402a and a standing portion 402b extending perpendicularly from the bent part or end section 402a. A collar portion 422 is formed on the standing portion 402b of the electrode 402. The electrode 402 is made of a conductive metal such as a copper plate. The outer end (not shown) of the electrode 402 is exposed on the outside of the module and has a threaded hole so that it can be screw-connected connected to an external bus bar. The bent part or end section 402a is electrically connected to the main conductor portion of the conductor 412 by solder 409 as shown in FIG. 8. Accordingly, in this embodiment, the electrode 402 and the conductor 412 together preferably constitute a second electrical conductor having a main conductor portion (the conductor 412 and the end section 402a) extending substantially parallel to the conductive base layer 4 and a standing portion (the standing portion 402b) extending from the main conductor portion in a direction away from the conductive base layer 4.

FIG. 9 depicts the connection parts in a slightly exaggerated and displaced fashion in order to clearly show the connection relationships between the conductors 411 and 412 and the electrodes 401 and 402. As shown in FIGS. 8 and 9, the standing portion 402b of the electrode 402 has a U-shaped cross section that encloses the electrode 401 in a U-shaped manner (i.e., along three sides). The U-shaped cross section of the standing portion 402b is defined by a pair of parallel leg sections that are connected together by a center or connecting section. The U-shaped cross section also defines a slot with a longitudinal opening having a transverse width or distance T2 formed between the leg sections of the standing portion 402b. This arrangement enables interference electromagnetic waves emitted from the space between the standing electrode portion 401b and the standing electrode portion 402b to be suppressed.

In other words, this embodiment, the insulation layer 5 has a first side surface that faces the front main surface of the conductive base layer 4. In this embodiment, the combination of the electrode 401 and the conductor 411 can be considered together to form the "first conductor." When assembled as shown in FIG. 8, the functions the electrode 401 and the conductor 411 are the same as the conductor 11. The conductor 411 faces a second side surface of the insulation layer 402. The combination of the electrode 402 and the conductor 412 can be considered together to form the "second conductor." When assembled as shown in FIG. 8, the functions the electrode 402 and the conductor 412 are the same as the conductor 12. The conductor 412 is configured such that current flows in the opposite direction as the current that flows through the conductor 411. As viewed from a line of sight normal to the first main surface of the conductive base layer 4, the conductor 412 completely covers the conductor 411 in the lateral direction such that the longitudinal edge parts of the conductor 412 protrude beyond the longitudinal edges of the conductor 411 at all locations. The conductors 411 and 412 have the standing portions 401b and 402b extending upwardly from the main conductor portions of the conductors 411 and 412, respectively, that are parallel to the main surface of the conductive base layer 4. The standing portion 402b of the conductor 412 encloses the standing portion 401b of the conductor 411 in a U-shaped manner.

By adopting such a configuration, the emission of interference electromagnetic waves from the high-voltage wiring inside a power module can be suppressed while using the same wiring materials as are used in conventional modules. Additionally, since the capacitance between the conductors 411 and 412 is increased and the wiring inductance is reduced, the induced power (which affects the transistor) that results during switching is reduced and the collector voltage overshoot value at turn-off is reduced. As a result, the switching speed can be increased. From another perspective, large currents can be driven unimpededly while leaving the switching speed the same. Also, although EMI is readily emitted from the standing portions 401b and 402b of the module conductors, EMI emitted from the standing portion 401b and 402b where the electrodes stand up from the conductors 411 and 412 can be suppressed.

Figure 10:
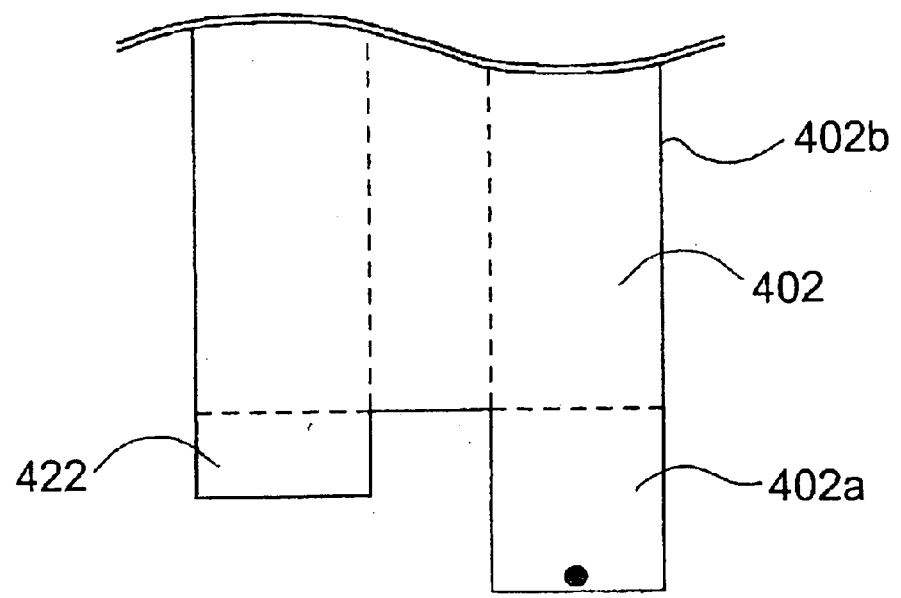
FIG. 10 is an unfolded top plan view of the plate-like electrode in accordance with the fourth embodiment of the present invention.

Referring now to FIG. 10, an unfolded view of part of the electrode 402 is illustrated with fold lines shown in broken lines. The dot mark (•) indicates an area of the bent part or end section 402a on the side that is solder-connected to the conductor 412. The shape of the solder connection is arbitrary. The shape of the solder connection can be dot-shaped like the dot mark (•) or it can cover the entire immediate region.

From the perspective of electrode resistance, the wall thickness of the electrode 402 is preferably thinner than the wall thickness of the electrode 401 so that the cross sectional areas of the electrodes 401 and 402 is approximately the same. For example, if the wall thickness of the electrode 402 is designed to be one-half the wall thickness of the electrode 401, then the electrode 402 is arranged such that the terminal part thereof, which is exposed on the outside of the module, comprises two overlapping plates, then both electrodes 401 and 402 can be provided with substantially the same current capacity without increasing the bulkiness or weight of the electrodes. By injecting plastic (not shown) having a high insulating characteristic between the electrode 401 and the surrounding U-shaped electrode 402, the electrodes 401 and 402 can be insulated from each other and secured together at the same time.

Although the electromagnetic field emanates from the opening of the U-shaped standing portion 402b of the electrode 402, the electromagnetic field emission can be effectively suppressed by setting the two dimensions shown in FIG. 9 appropriately, i.e., setting the value $x = d2/T2$ appropriately, where the distance T2 is the distance of a line segment extending between the leg sections of the U-shaped electrode 402 in the cross sectional view and the distance d2 is the distance from the longitudinal free end edges of the leg sections to the adjacent edge of the electrode 401.

Figure 11:
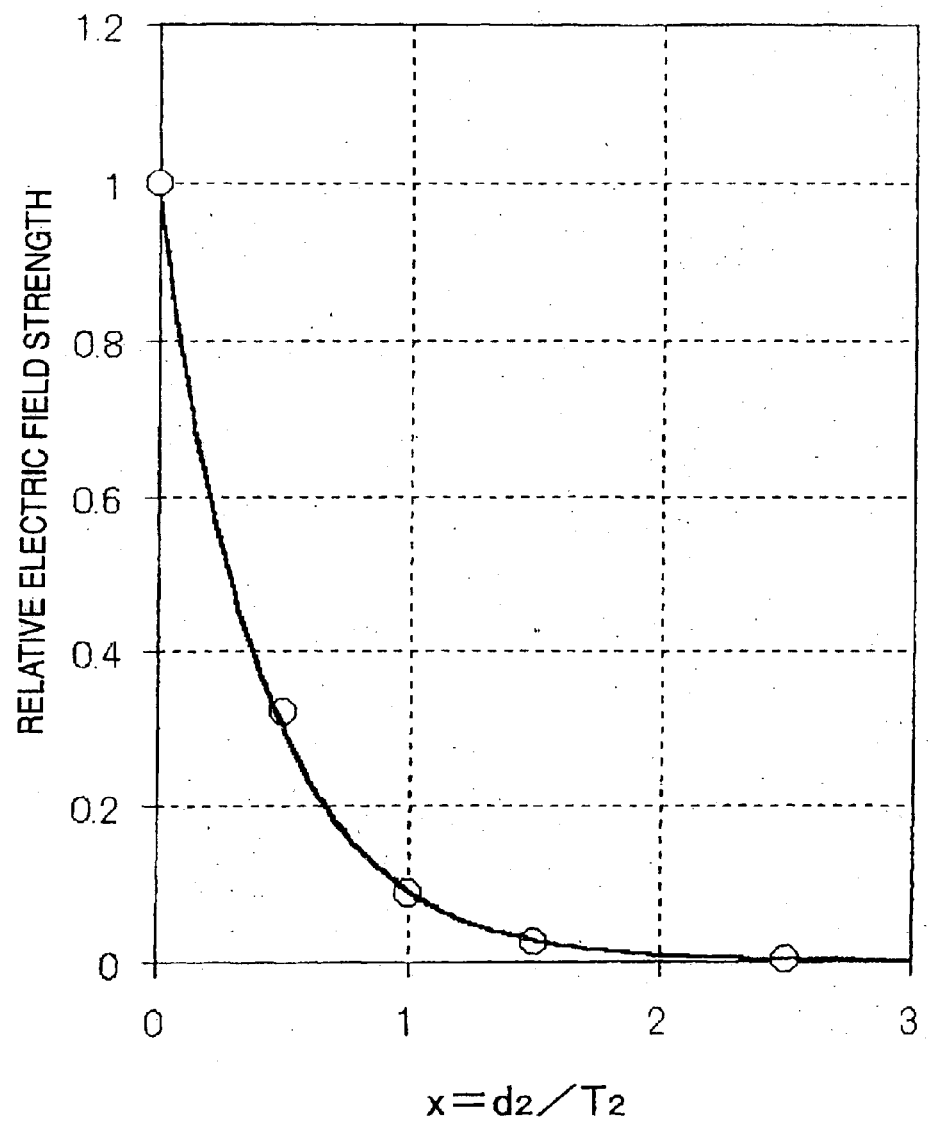
FIG. 11 is a graph illustrating the dependence of the electric field strength surrounding the second electrode relative to the parameter (d2/T2) in accordance with the fourth embodiment of the present invention.

FIG. 11 is a graph showing the electric field strength at an arbitrary point along the direction of the opening and using x as a parameter. When x=0.25, the electric field strength becomes one-half of the electric field strength when x=0. This indicates a marked electric field suppressing effect. At x=1, the electric field strength is reduced to 1/10. At x=2, the electric field strength is reduced to approximately 1/100. The only factor on which the electric field suppression effect is substantially dependent upon is the value of x. So long as this value remains the same, the cross sectional shape of the electrode 402 is not limited to a U-shaped form and the same effect can be achieved with any arbitrary shape.

In short, with this structure, in a cross sectional view of the standing portions 401b and 402b of the first and second conductors, the standing portion 401b of the first conductor is positioned further inward than the length or distance T2 of the line segment joining the leg sections of the U-shaped standing portion 402b of the second conductor 402. This arrangement enables the EMI suppression effect to be increased even further.

The collar portion 422 extends form one of the leg sections of the standing portion 402b such that the collar portion 422 faces the insulation layer 5. In other words, the collar portion 422 is located on the opposite side of the standing portion 402b from the bent part or end section 402a where the electrode 402 connects to the conductor 412.

Figure 12:
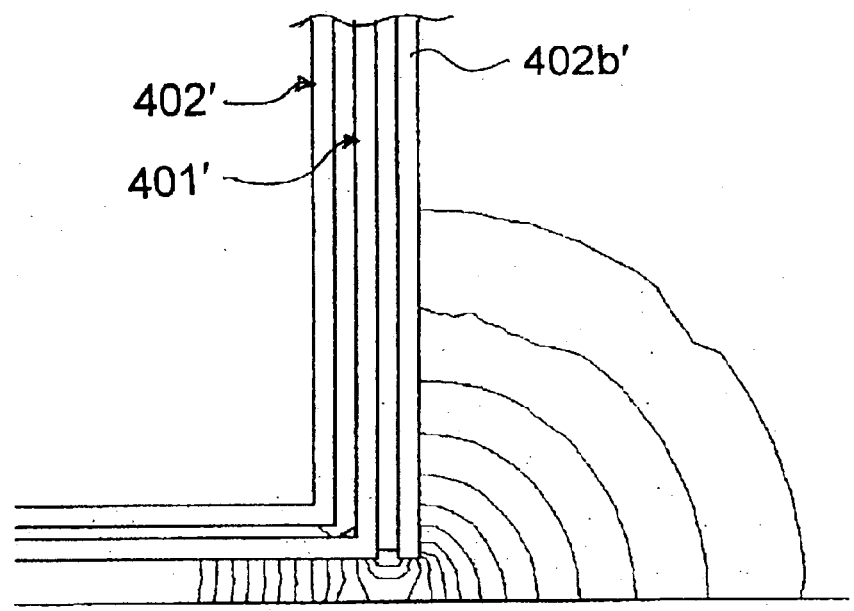
FIG. 12 shows the electric field strength distribution when the standing portion does not have a collar portion.
Figure 13:
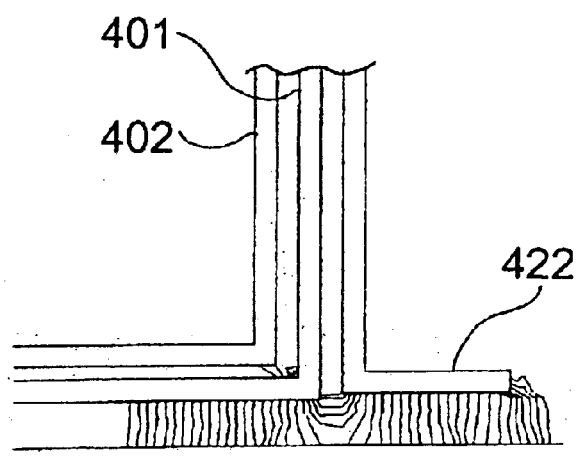
FIG. 13 shows the electric field strength distribution when the standing portion has a collar portion in accordance with the fourth embodiment of the present invention.

The cross sectional view of FIG. 12, which corresponds to FIG. 3, shows the electric field distribution having a wiring structure with electrodes 401' and 402' when the collar portion 422 has been eliminated from the standing portion 402b'. The equipotential lines have the same meaning as those in FIG. 3. The electric field spreads at the standing portion due to the mirror image of the electrode 402. Meanwhile, when the collar portion 422 is attached as shown in FIG. 13, a striking electric field suppressing effect is achieved. This effect, too, is determined by the dimensions shown in FIG. 8, i.e., by the value x'=d3/T3, where the distance d3 is the width of the collar portion 422 as shown in FIG. 8, and the distance T3 is the distance from the collar portion 422 to the conductive base layer 4.

Figure 14:
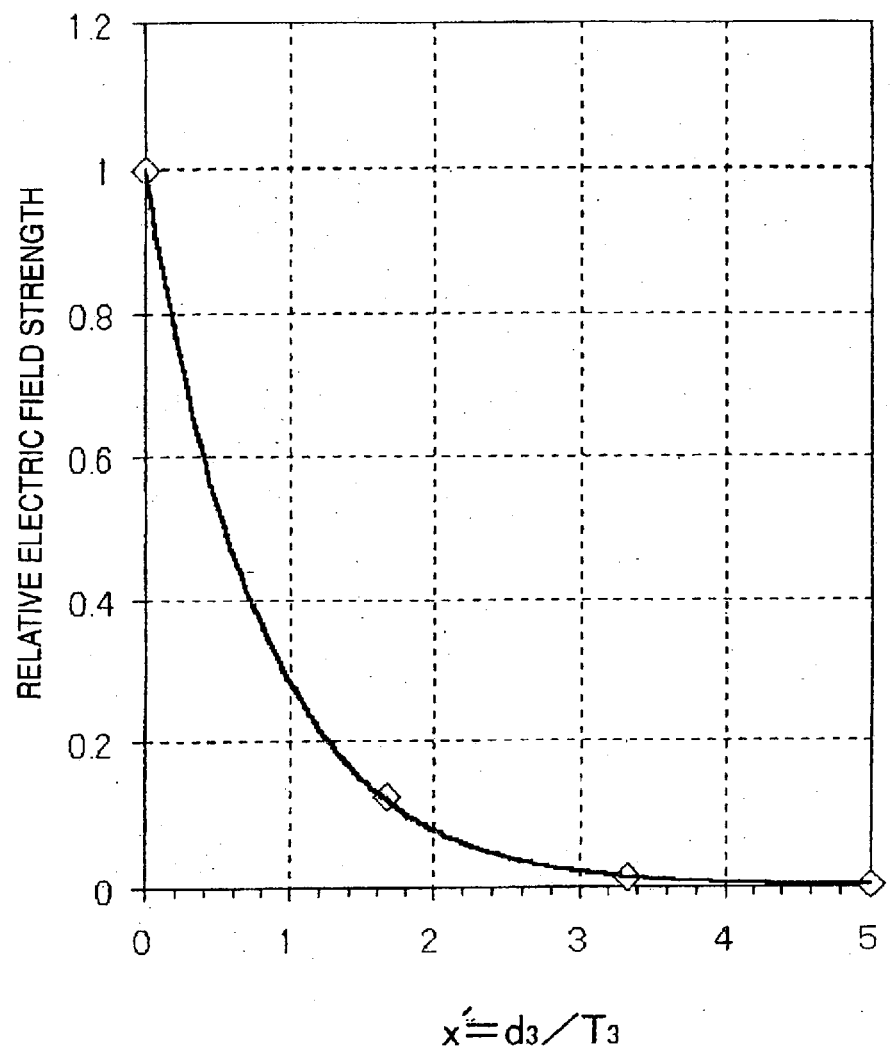
FIG. 14 is a graph illustrating the dependence of the electric field strength surrounding the standing portions relative to the parameter (d3/T3) in accordance with the fourth embodiment of the present invention.

FIG. 14 is a graph showing the electric field strength of the insulation layer surface at an arbitrary distance from the collar portion 422 and using x' as a parameter. According to this graph, when x'=0.5, i.e., when the distance d3 is one-half the distance T3, the electric field strength becomes one-half of the electric field strength when x'=0. This indicates a marked electric field suppressing effect. At x'=2 the electric field strength is reduced to 1/10 or less. At x'=4, the electric field strength is reduced to 1/100 or less.

In short, with this structure, a collar portion 422 that is parallel to the main surface, does not face the first conductor, and faces the insulation layer 5 is provided on the end part of the U-shaped standing portion 402b of the second conductor that does not join a portion of the second conductor that is parallel to the main surface. This arrangement enables the EMI suppression effect to be increased even further.

Fifth Embodiment

Figure 15:
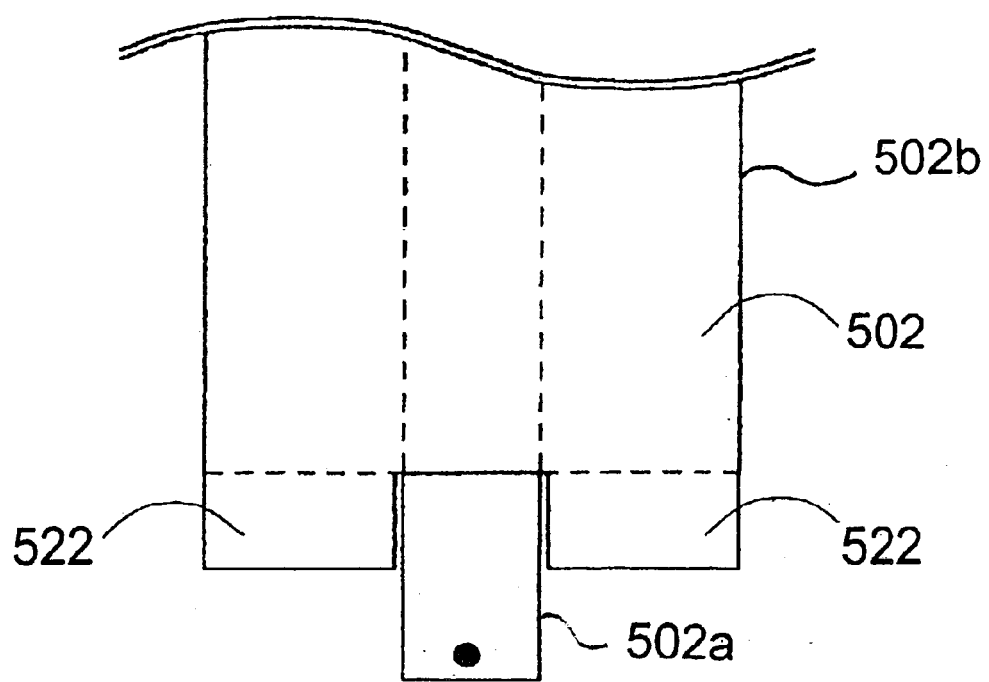
FIG. 15 is an unfolded top plan view of an alternative arrangement for a second electrode in accordance with a fifth embodiment of the present invention.
Figure 16:
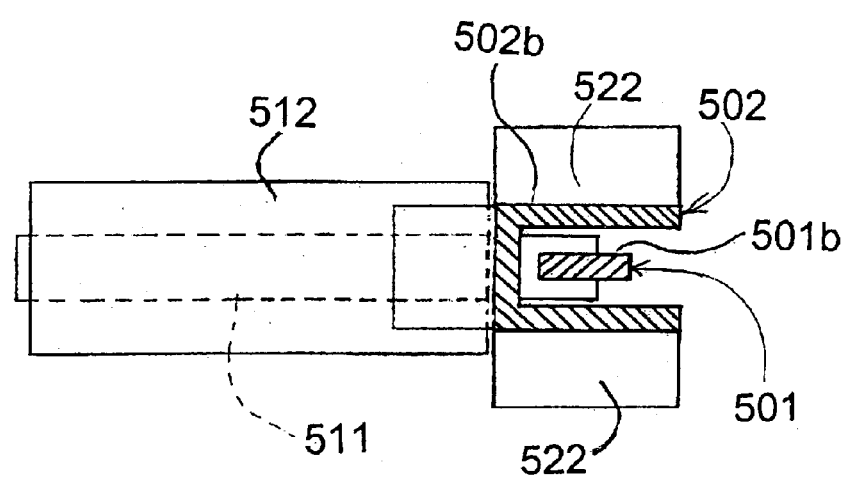
FIG. 16 is a top plan view illustrating the second electrode of FIG. 15 in accordance with the fifth embodiment of the present invention.

Referring now to FIGS. 15 and 16, a wiring structure in accordance with a fifth embodiment will now be explained. In view of the similarity between the fourth and fifth embodiments, the descriptions of the parts of the fifth embodiment that are substantially identical to the parts of the fourth embodiment may be omitted for the sake of brevity. Basically, the wiring structure of fifth embodiment is replaced with the wiring structure of the first embodiment illustrated in FIG. 1. The wiring structure of the fifth embodiment includes a first conductor 511 and a second conductor 512. Similarly to the previously explained embodiments, the distance between the first conductor 511 and the second conductor 512 is maintained, for instance, by inserting a thin insulating film between them. These parts 511 and 512 are substituted for the parts 11 and 12 of the first embodiment, i.e., mounted on the conductive base layer 4 and the insulation layer 5 of the first embodiment.

Referring now to FIG. 15, an unfolded view of part of the electrode 502 is illustrated with fold lines shown in broken lines. FIG. 15 basically corresponds to FIG. 10. Similar to the fourth embodiment, the electrode 502 includes a bent part or end section 502a, a U-shaped standing portion 502b and a collar portion 522. Referring now to FIG. 16, a top plan view of the electrode 502 is illustrated that is similar to FIG. 9. In this way, the main surfaces of the electrodes 501 and 502 can be oriented freely with respect to the conductors 511 and 512. Basically, the standing portions 501b and 502b are oriented relative to each other and the insulation layer 5 in a similar manner as in the fourth embodiment, except that the standing portions 501b and 502b are oriented ninety degrees from the standing portions 401b and 402b of the fourth embodiment.

Sixth Embodiment

Figure 17:
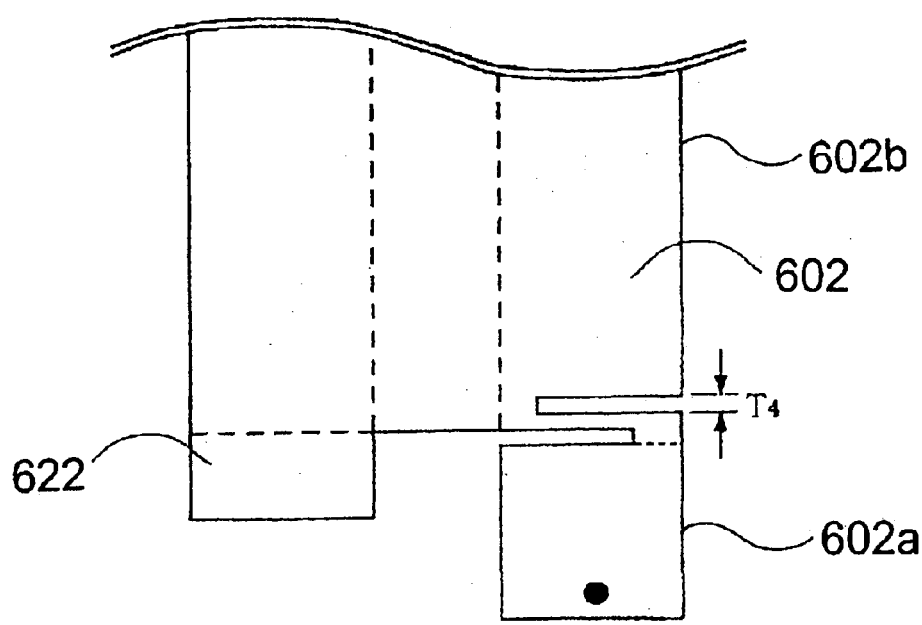
FIG. 17 is an unfolded top plan view of an alternative arrangement for a second electrode in accordance with the sixth embodiment of the present invention.
Figure 18:
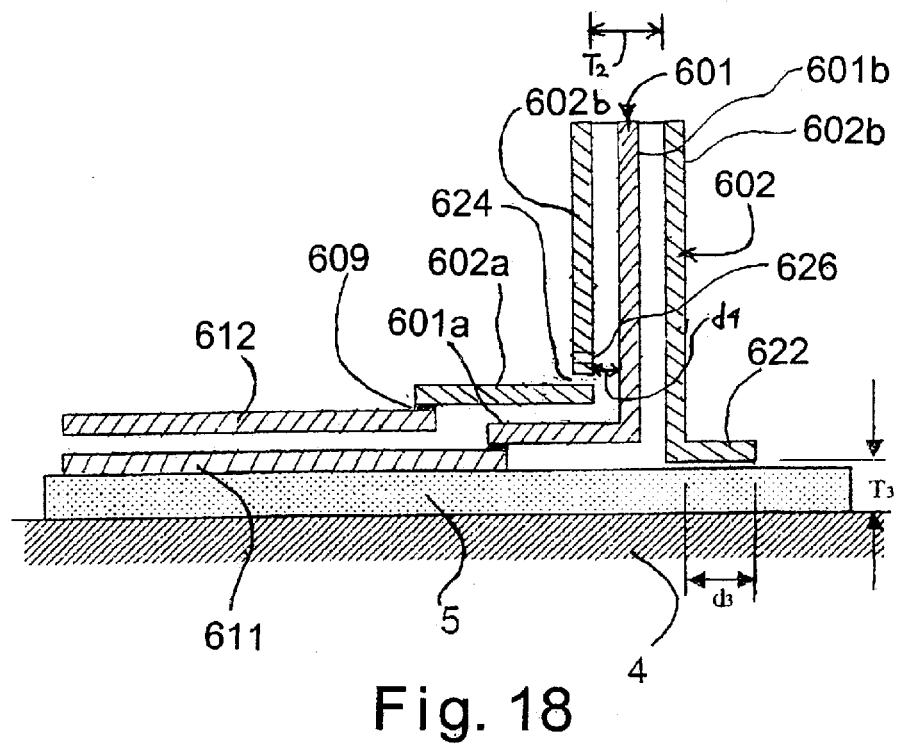
FIG. 18 is a partial diagrammatic longitudinal cross sectional view of a wiring structure in accordance with the sixth embodiment of the present invention.

Referring now to FIGS. 17 and 18, a wiring structure in accordance with a sixth embodiment will now be explained. In view of the similarity between this embodiment and the prior embodiments, the descriptions of the parts of this embodiment that are substantially identical to the parts of the prior embodiments may be omitted for the sake of brevity. The arrangement illustrated FIGS. 17 and 18 is designed to alleviate the stress in the connection between an electrode 602 and a conductor 612 while maintaining the effects of the present invention. Basically, the combination of the electrode 602 and the conductor 612 can be used in each of the prior embodiments by replacing the corresponding parts of the prior embodiments.

FIG. 17 is an unfolded view of a part of the electrode 602 which includes a bent part or end section 602a and a standing portion 602b (only a part shown). FIG. 18 depicts the connection parts in a slightly exaggerated and displaced fashion in order to clearly show the connection relationships between the conductors 611 and 612 and the electrodes 601 and 602. In FIG. 17, two parallel slits or notches 624 and 626 are provided in one of the leg sections of the standing portion 602b adjacent the fold line that exists between the standing portion 602b of the electrode 602 and the end section 602a that is connected to the conductor 612. The slits 624 and 626 are substantially parallel with a ridge or fold line where the end section 602a extends from the standing portion 602b. Each of the slits 624 and 626 has a transverse width T4. As seen in FIG. 18, the slits 624 and 626 are spaced from the first electrode 601 by a distance d4. Preferably, the transverse widths T4 of the slits 624 and 626 are less than or equal to twice the distance d4 to reduce the amount of electromagnetic wave leakage.

As seen in FIG. 18, when the electrode 602 is folded, the standing portion 602b extends perpendicularly from the bent part or end section 602a in the folded state. In other words, the end section 602a extends outwardly from the standing portion 602b, and is coupled to the top surface of the main conductor portion of the conductor 612. A collar portion 622 is formed on the standing portion 602b of the electrode 602 that extends in an opposite direction to the end section 602a. The electrode 602 is made of a conductive metal such as a copper plate. The outer end (not shown) of the electrode 602 is exposed on the outside of the module, and has a threaded hole so that it can be screw-connected to an external bus bar. The bent part or end section 602a is electrically connected to the conductor 612 by solder 609 as shown in FIG. 18.

As shown in FIG. 18, the standing portion 602b of the electrode 602 has a U-shaped cross section that encloses the electrode 601 as the same manner in FIG. 9. The U-shaped cross section of the standing portion 602b is defined by a pair of parallel leg sections that are connected together by a center or connecting section. The U-shaped cross section also defines a slot having a longitudinal opening with a transverse width or distance T2 formed between the leg sections of the standing portion 602b. This arrangement shown in FIG. 18 enables interference electromagnetic waves emitted from the space between the standing electrode portion 601b and the standing electrode portion 602b to be suppressed.

In this embodiment, the narrowed region created by the slits 624 and 626 alleviate stresses during mounting. Although there is leakage of electromagnetic waves from the slits 624 and 626, the amount of electromagnetic wave leakage can be greatly reduced by designing such that the value x"=d4/T4 is 0.5 or greater, where the distance T4 is the transverse width of each of the slits 624 and 626 and the distance d4 is the distance from the slits 624 and 626 to the first electrode 601. Although not illustrated, the same stress alleviating effect can be obtained for the electrode 601 by providing a similar slit.

Seventh Embodiment

Figure 19:
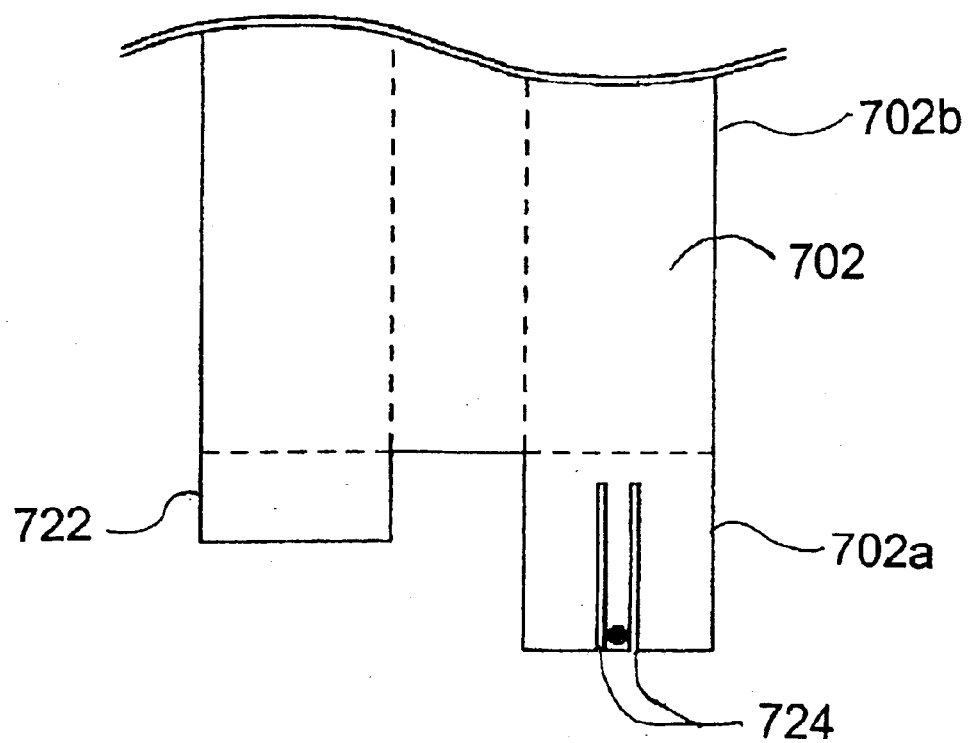
FIG. 19 is an unfolded top plan view of an alternative arrangement for a second electrode in accordance with a seventh embodiment of the present invention.
Figure 20:
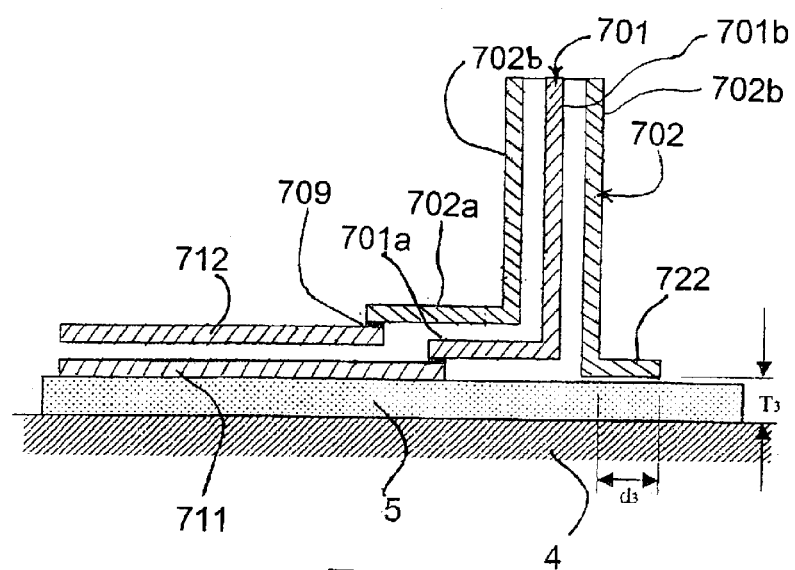
FIG. 20 is a partial diagrammatic longitudinal cross sectional view of a wiring structure in accordance with the seventh embodiment of the present invention.
Figure 21:
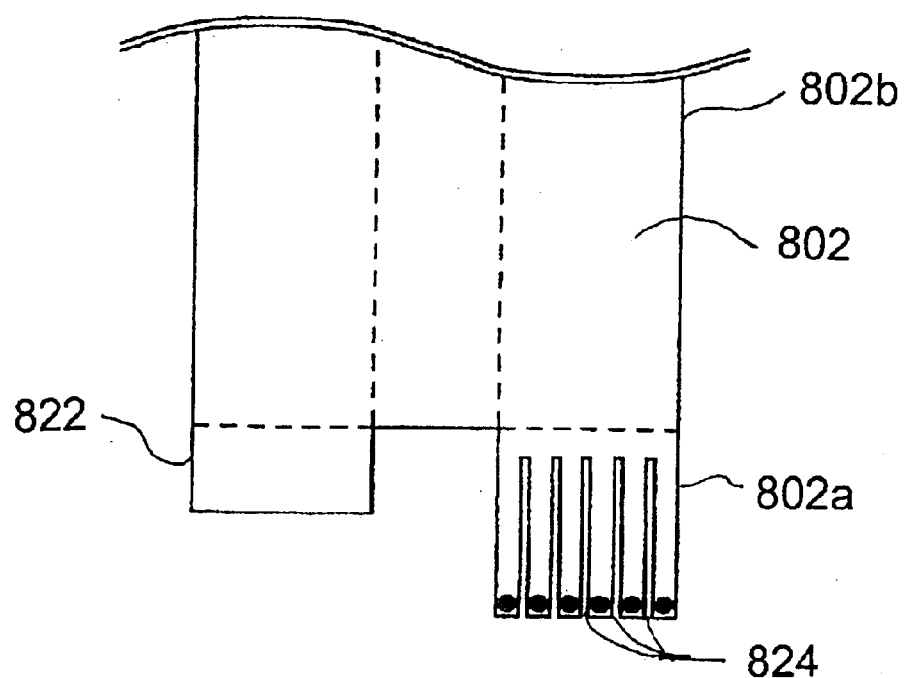
FIG. 21 is an unfolded top plan view of an alternative arrangement for a second electrode in accordance with an eighth embodiment of the present invention.

Referring now to FIGS. 19 and 20, a wiring structure in accordance with a seventh embodiment will now be explained. In view of the similarity between this embodiment and the prior embodiments, the descriptions of the parts of this embodiment that are substantially identical to the parts of the prior embodiments may be omitted for the sake of brevity. FIGS. 19 and 21 illustrate an arrangement that alleviate the stress in the connecting parts while maintaining the effects of the present invention. Basically, the combination of the electrode 702 and the conductor 712 can be used in each of the prior embodiments by replacing the corresponding parts of the prior embodiments.

FIG. 19 is an unfolded view of a part of the electrode 702 that is similar to FIGS. 10 and 17. FIG. 20 depicts the connection parts in a slightly exaggerated and displaced fashion in order to clearly show the connection relationships between the conductors 711 and 712 and the electrodes 701 and 702. The electrode 702 basically includes a bent part or end section 702a and a standing portion 702b. In particular, FIG. 19 illustrates an unfolded view of a bent part or end section 702a and a part of the standing portion 702b of the electrode 702.

As seen in FIG. 20, the standing portion 702b extends perpendicularly from the end section 702a in the folded state. A collar portion 722 is formed on the standing portion 702b of the electrode 702 that extends in an opposite direction to the end section 702a. The electrode 702 is made of a conductive metal such as a copper plate. The outer end (not shown) of the electrode 702 is exposed on the outside of the module, and has a threaded hole so that it can be screw-connected to an external bus bar. The end section 702a is electrically connected to the conductor 712 by solder 709.

The standing portion 702b of the electrode 702 shown in FIG. 20 has a U-shaped cross section that encloses the electrode 701 as the same manner in FIG. 9. The spacing between the electrodes 701 and 702 and the spacing between the conductors 711 and 712 are preferably the same as the prior embodiments. The U-shaped cross section of the standing portion 702b is defined by a pair of parallel leg sections that are connected together by a center or connecting section. The U-shaped cross section also defines a slot having a longitudinal opening with a transverse width or distance formed between the leg sections of the standing portion 702b. This arrangement enables interference electromagnetic waves emitted from the space between the standing electrode portion 701b and the standing electrode portion 702b to be suppressed.

FIG. 20 shows a portion of the electrode 702 where the conductor is soldered to the electrode 702. Two lengthwise slits 724 are provided in this portion and the solder connection is made only at the portion indicated with a dot mark (•) in FIG. 19. In particular, the end section 702a of the second electrical conductor 712 extends outwardly from the standing portion 702b in a direction substantially parallel to the first main surface of the conductive base layer 4. The end section 702a is coupled to the main conductor portion of the second electrical conductor 712. The lengthwise slits 724 of the end section 702a are arranged to extend perpendicularly to a ridge line (fold line) formed between the end section 702a and one of the leg sections. The lengthwise slits 724 have transverse widths that are less than or equal to twice a spacing formed between the end section 702a and the first conductor 711.

Since thermal strain during assembly occurs only in the vertical directions (directions perpendicular to the main surface of the conductive base layer 4), the formation of this kind of slender region allows flexing of the metal that constitutes the electrodes and thus makes it possible to considerably reduce stress.

Eighth Embodiment

Referring now to FIG. 21, a wiring structure in accordance with an eighth embodiment will now be explained. In view of the similarity between this embodiment and the prior embodiments, the descriptions of the parts of this embodiment that are substantially identical to the parts of the prior embodiments may be omitted for the sake of brevity. FIG. 21 illustrate an arrangement similar to the seventh embodiment that alleviate the stress in the connecting parts while maintaining the effects of the present invention. Basically, the combination of the electrode 802 can be used in each of the prior embodiments by replacing it with the corresponding part of the prior embodiments.

FIG. 21 is an unfolded view of a part of the electrode 802 that is similar to FIGS. 10, 17 and 19. As shown in FIG. 21, the electrode 802 includes a bent part or end section 802a and a standing portion 802b extending perpendicularly from the bent part or end section 802a. A collar portion 822 is formed on the standing portion 802b of the electrode 802 that extends in an opposite direction to the end section 802a, after folding. The electrode 802 is made of a conductive metal such as a copper plate. The outer end (not shown) of the electrode 802 is exposed on the outside of the module, and has a threaded hole so that it can be screw-connected to an external bus bar. The end section 802a is electrically connected to a conductor by solder.

After folding, the standing portion 802b of the electrode 802 has a U-shaped cross section that encloses the first electrode in a U-shaped manner (i.e., along three sides). The spacing between the electrodes 801 and 802 and the spacing between the conductor 811 the other conductor (not shown) are preferably the same as the prior embodiments. In other words, after folding and coupling the electrode 802 to a first electrode, the standing portion 802b of the electrode 802 partially surrounds the first electrode in a manner identical to FIG. 20. The U-shaped cross section of the standing portion 802b is defined by a pair of parallel leg sections that are connected together by a center or connecting section. The U-shaped cross section also defines a slot having a longitudinal opening with a transverse width or distance formed between the leg sections of the standing portion 802b. This arrangement enables interference electromagnetic waves emitted from the space between the standing electrode portion 801b and the standing electrode portion 802b to be suppressed. FIG. 21 further shows an arrangement in which the bent part or end section 802a comprises a plurality of narrow, flexible strips formed by slits 824. The lengthwise slits 824 of the end section 802a are arranged to extend perpendicularly to a ridge line formed between the end section 802a and one of the leg sections. The lengthwise slits 824 have transverse widths that are less than or equal to twice a spacing formed between the end section 802a and the first conductor 811. This arrangement allows the same effect to be obtained as the prior embodiments, while ensuring sufficient current capacity. Here, again, dot marks (•) indicate the connections with the electrode 802.

Moreover, terms that are expressed as "means-plus function" in the claims should include any structure that can be utilized to carry out the function of that part of the present invention.

The terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

This application claims priority to Japanese Patent Application No. 2002-167509. The entire disclosure of Japanese Patent Application No. 2002-167509 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A wiring structure comprising:
a conductive base layer having a first base surface;
an insulation layer having first and second main surfaces with the first main surface facing the first base surface of the conductive base layer;
a first electrical conductor being arranged to face the second main surface of the insulation layer; and
a second electrical conductor arranged relative to the first electrical conductor such that a current direction in the second electrical conductor is opposite to a current direction of the first electrical conductor, the second electrical conductor being electrically separated from the conductive base layer,
the second electrical conductor overlying the first electrical conductor such that edges of the second electrical conductor extend beyond corresponding edges of the first electrical conductor at all locations by predetermined distances,
a width of the conductive base layer being wider than a width of the second electrical conductor.

2. The wiring structure as recited in claim 1, wherein the insulation layer having a width that is smaller than the width of the conductive base layer.

3. The wiring structure as recited in claim 2, wherein the width of the insulation layer is wider than the width of the second electrical conductor.

4. A wiring structure comprising:
a conductive base layer having a first base surface;
an insulation layer having first and second main surfaces with the first main surface facing the first base surface of the conductive base layer;
a first electrical conductor being arranged to face the second main surface of the insulation layer; and
a second electrical conductor arranged relative to the first electrical conductor such that a current direction in the second electrical conductor is opposite to a current direction of the first electrical conductor,
the second electrical conductor overlying the first electrical conductor such that edges of the second electrical conductor extend beyond corresponding edges of the first electrical conductor at all locations by predetermined distances,
a width of the conductive base layer being wider than a width of the second electrical conductor,
the predetermined distances by which the edges of the second electrical conductor extend beyond the edges of the first electrical conductor being at least one-half of a distance from the edges of the second electrical conductor to the first base surface of the conductive base layer.

5. A wiring structure comprising:
a conductive base layer having a first base surface;
an insulation layer having first and second main surfaces with the first main surface facing the first base surface of the conductive base layer;
a first electrical conductor being arranged to face the second main surface of the insulation layer; and
a second electrical conductor arranged relative to the first electrical conductor such that a current direction in the second electrical conductor is opposite to a current direction of the first electrical conductor,
the second electrical conductor overlying the first electrical conductor such that edges of the second electrical conductor extend beyond corresponding edges of the first electrical conductor at all locations by predetermined distances,
each of the first and second electrical conductors having a main conductor portion extending substantially parallel to the first base surface of the conductive base layer and a standing portion extending from the main conductor portion in a direction away from the conductive base layer, and the standing portion of the second electrical conductor having a U-shaped cross section defined by a pair of leg sections and a center section extending between the leg sections that are arranged to partially enclose the standing portion of the first electrical conductor.

6. The wiring structure as recited in claim 5, wherein the standing portion of the first electrical conductor extends between the leg sections of the standing portion of the second electrical conductor such that the standing portion of the first electrical conductor does not extend laterally out of the U-shaped cross section of the standing portion of the second electrical conductor.

7. The wiring structure as recited in claim 6, wherein the leg sections of the standing portion of the second electrical conductor have free end edges defining a longitudinal opening of the U-shaped cross section that are spaced apart by a first distance, and the standing portion of the first electrical conductor is spaced from the free end edges of the leg sections of the standing portion of the second electrical conductor by a second distance that is at least one-fourth of the first distance.

8. The wiring structure as recited in claim 5, wherein a first of the leg sections of the standing portion of the second electrical conductor has a collar portion extending above the insulation layer and substantially parallel to the first base surface of the conductive base layer in an area such that the first electrical conductor is not disposed between the collar portion and the insulation layer.

9. The wiring structure as recited in claim 8, wherein the collar portion extends outwardly from the first of the leg sections of the standing portion of the second electrical conductor by a distance that is at least one-half of a distance formed between the collar portion and the first base surface of the conductive base layer.

10. The wiring structure as recited in claim 5, wherein the second electrical conductor further includes an end section extending outwardly from the standing portion of the second electrical conductor that is coupled to the main conductor portion of the second electrical conductor, and a slit being located adjacent an area where the end section extends from the standing portion of the second electrical conductor, the slit extending substantially parallel to a ridge line formed between the end section and one of the leg sections, and the slit has a transverse width that is less than or equal to twice a distance between the standing portion and the first electrical conductor.

11. The wiring structure as recited in claim 5, wherein the standing portion of the second electrical conductor further includes an end section extending outwardly from the standing portion of the second electrical conductor in a direction substantially parallel to the first base surface of the conductive base layer, the end section being coupled to the main conductor portion of the second electrical conductor, the end section having a slit arranged to extend perpendicularly to a ridge line formed between the end section and one of the leg sections, and the slit having a transverse width is less than or equal to twice a spacing formed between the end section and the first electrical conductor.

12. A wiring structure comprising:

base means for forming a conductive layer having a first base surface;

insulation means for overlying and insulating the first base surface of the base means;

first electrical conductive means for conducting electrical current and being disposed over the insulation means; and second electrical conductive means for conducting electrical current and being arranged relative to the first electrical conductive means such that a current direction in the second electrical conductive means that is opposite to a current flowing direction of the first electrical conductive means, the second electrical conductive means being electrically separated from the conductive layer of said base means, the second electrical conductive means overlying the first electrical conductive means such that edges of the second electrical conductive means extend beyond corresponding edges of the first electrical conductive means at all locations by predetermined distances, a width of the base means being wider than a width of the second electrical conductive means.

13. A wiring structure comprising:

a conductive base layer having a first base surface:

an insulation layer having first and second main surfaces with the first main surface facing the first base surface of the conductive base layer;

a first electrical conductor being arranged to face the second main surface of the insulation layer; and a second electrical conductor arranged relative to the first electrical conductor such that a current direction in the second electrical conductor is opposite to a current direction of the first electrical conductor, the second electrical conductor overlying the first electrical conductor such that edges of the second electrical conductor extend beyond corresponding edges of the first electrical conductor at all locations by predetermined distances, a width of the conductive base layer being wider than a width of the second electrical conductor, the conductive base layer and the first and second electrical conductors being arranged to form a surrounding electric field that is distributed to replicate an electric field distribution in which the conductive base layer was removed and additional first and second electrical conductors were disposed to form a mirror image of the first and second electrical conductors with respect to the conductive base layer.

14. A wiring structure comprising:

a conductive base layer having a first base surface;

an insulation layer having first and second main surfaces with the first main surface facing the first base surface of the conductive base layer;

a first electrical conductor being arranged to face the second main surface of the insulation layer; and a second electrical conductor arranged relative to the first electrical conductor such that a current direction in the second electrical conductor is opposite to a current direction of the first electrical conductor, the second electrical conductor overlying the first electrical conductor such that edges of the second electrical conductor extend beyond corresponding edges of the first electrical conductor at all locations by predetermined distances, a width of the conductive base layer being wider than a width of the second electrical conductor, the insulation layer has a width that being wider than the width of the second electrical conductor.

15. The wiring structure as recited in claim 14, wherein the insulation layer having a width that is smaller than the width of the conductive base layer.

* * * * *